(12) United States Patent
Lee

(10) Patent No.: US 6,221,722 B1
(45) Date of Patent: Apr. 24, 2001

(54) METHOD OF FABRICATING MASK ROM

(75) Inventor: Ki Jik Lee, Chungcheongbuk-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/642,082

(22) Filed: Aug. 21, 2000

(30) Foreign Application Priority Data

Aug. 21, 1999 (KR) .................................................. 99-34805

(51) Int. Cl.[7] .............................................. H01L 21/8246
(52) U.S. Cl. .......................................... 438/275; 438/276
(58) Field of Search ................................... 438/275–278

(56) References Cited

U.S. PATENT DOCUMENTS 5,091,328 * 2/1992 Miller .
5,275,959 * 1/1994 Kobayashi et al. .
5,429,974   7/1995 Hsue et al. .

* cited by examiner

*Primary Examiner*—Jey Tsai
(74) *Attorney, Agent, or Firm*—Morgan, Lewis & Bockius LLP

(57) ABSTRACT

A method of fabricating a mask ROM that includes forming a plurality of buried bitlines in an upper surface of a semiconductor substrate at fixed intervals and a plurality of wordlines on the semiconductor substrate perpendicular to the buried bitlines; forming an interlayer insulating film having a bitline contact hole on an entire first surface of the semiconductor substrate inclusive of the wordlines; forming a metal pattern in contact with the buried bitlines through the contact hole; forming a ROM code mask on the metal pattern; forming a plurality of ROM code ion implantation regions by selectively etching the interlayer insulating film with the ROM code mask; and forming a protection film on an entire second surface of the semiconductor substrate by implanting ROM code ions in the ROM code ion implantation regions.

12 Claims, 8 Drawing Sheets

METHOD OF FABRICATING MASK ROM

This application claims the benefit of Korean application no. P1999-34805 filed on Aug. 21, 1999, which is hereby incorporated by reference.

BACKGROUND OF THE INVENTION

1. Field of the Invention

This invention relates to a method of fabricating a semiconductor device, and more particularly, to a method of fabricating a mask Read Only Memory (ROM), in which a coding step is adjusted for reducing turn-around time.

2. Discussion of the Related Art

Erasure of and writing on a mask ROM, a nonvolatile memory, is, in general, not possible since code ion implantation, i.e., programming, is done in a device fabrication process. Data programming on the mask ROM is done by using NOR contact, NOR type ion implantation, or NAND type ion implantation.

A conventional method of fabricating a mask ROM will be explained with reference to FIGS. 1 and 2A through 2D. Referring to FIG. 1, a conventional method of fabricating a mask ROM begins with an initial fabrication step of a general ROM 100, i.e., bitlines for use as a drain/source and wordlines for use as gates are formed. This initial step 100 starts with forming a plurality of buried bitlines 14 in an N-type semiconductor substrate 11 having a P-type well 12 formed therein and a plurality of wordlines 16 vertical to the buried bitlines 14. In a ROM code lithography step 101, according to custom data, a photoresist film 17 for a ROM code mask is coated, patterned, and exposed. In a code ion implantation step 102, code ions, such as Boron ions, are selectively implanted. In a first deposition step 103, a Chemical Vapor Deposition (CVD) oxide film 18 is deposited on the wordline 16. In a second deposition step 104, a Boron Phosphorous Silicate Glass (BPSG) oxide film 19 is deposited. In a contact lithography step 105, the BPSG oxide film 19 is removed selectively to form a contact (not shown). In a metal etch step 106, a metal is deposited on an entire surface, including the contact, and subjected to selective photolithography and etching to form a metal pattern 20. In a passivation step 107, a CVD oxide film is deposited on the entire surface, thereby forming a protection film i.e., passivation, (not shown). Pad lithography and etching are conducted in a pad lithography step 108. An alloy is then formed in an alloy forming step 109. A wafer yield prediction is made in a yield prediction step 110, and a wafer level circuit test is conducted in a circuit test step 111. Since code ions are implanted in a certain region, i.e., a channel region of a cell transistor after the wordlines are formed, the conventional method 112 of fabricating a mask ROM takes approximately two weeks to complete.

Referring to FIG. 2A, an N-type semiconductor substrate 11 is lightly doped with P-type impurity ions to form a P-well 12. Then, a Local Oxidation of Silicon (LOCOS) is used to form a field oxide film 13 on a region of the substrate 11. Boron ions are implanted in a surface of the P-type well of the substrate 11 excluding the field oxide film 13 for adjusting a threshold voltage between approximately 0.9V and 1.2V.

Referring to FIG. 2B, a buried N+ mask (BN+ mask) is used in implanting arsenic ions in the P-type well 12. Then, the arsenic ions are activated for forming a plurality of bitlines 14 at fixed intervals. A gate oxide film 15 is formed on the substrate 11 and a doped polysilicon is deposited on the gate oxide film 15. A first photoresist film (not shown) is then coated on the polysilicon layer and subjected to selective patterning by exposure and etching, thereby forming a plurality of wordlines 16. The buried bitlines 14 and the wordlines 16 are perpendicular to each other.

Referring to FIG. 2C, a second photoresist film (not shown) is coated on the wordlines 16 and subjected to patterning using a code mask. A resulting patterned photoresist film 17 and the wordlines 16 are used as masks in implanting code ions, such as boron ions, to pull-up a cell threshold voltage. Thus, data coding of the mask ROM is done by ion implantation of code ions in a channel region of the cell transistor.

As illustrated in FIG. 2D, a CVD oxide film 18 and a BPSG film 19 are deposited on the wordlines 16 and subjected to annealing and reflowing. The BPSG film 19 is selectively removed to expose the buried bitlines 14 which serve as a source/drain of the cell transistor, forming a contact (not shown) and thereafter forming a metal pattern 20. Then, a protection film 21 is formed on the metal pattern 20.

A disadvantage of the conventional method for fabricating a mask ROM is that a turn-around time on the custom data after coding is prolonged because the code ions are implanted before the metal pattern is formed.

SUMMARY OF THE INVENTION

Accordingly, the claimed invention is directed to a method of fabricating a mask ROM that substantially obviates one or more of the problems due to limitations and disadvantages of the related art. An object of the claimed invention is to provide a method of fabricating a mask ROM that can shorten a turn-around time.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a method of fabricating a mask ROM of the claimed invention includes forming a plurality of buried bitlines in an upper surface of a semiconductor substrate at fixed intervals and a plurality of wordlines on the semiconductor substrate perpendicular to the buried bitlines. An interlayer insulating film having a bitline contact hole is formed on an entire first surface of the semiconductor substrate inclusive of the wordlines. A metal pattern in contact with the buried bitlines through the contact hole is formed. A ROM code mask is formed on the metal pattern. The ROM code mask is used to selectively etch the interlayer insulating film, thereby forming a plurality of ROM code ion implantation regions. ROM code ions are implanted in the ROM code ion implantation regions, which form a protection film on an entire second surface of the semiconductor substrate.

In another aspect, the claimed invention for a method of fabricating a mask ROM includes forming a plurality of buried bitlines at fixed intervals in an upper semiconductor surface. A gate insulating film is formed on a semiconductor substrate. A plurality of wordlines is formed on the gate insulating film perpendicular to the buried bitlines. On an entire surface of the semiconductor substrate, inclusive of the wordlines, an interlayer insulating film is formed. The interlayer insulating film is patterned selectively to form a contact hole. A metal layer is formed on an entire first surface of the semiconductor substrate, inclusive of the contact hole, and the metal layer is patterned to form a metal pattern. A photoresist film is deposited on an entire second surface of the semiconductor substrate, inclusive of the metal pattern, and the photoresist film is exposed and developed to form a second photoresist film for a ROM code mask. The interlayer insulating film is etched using the second photoresist film for the ROM code mask as a first mask, which exposes a plurality of ROM code ion implantation regions. The second photoresist film for the ROM code mask is removed, which exposes a ROM code mask layer. Code ions are implanted into the ROM code ion implantation regions by using the ROM code mask layer as a second mask. A protection film is formed on an entire third surface of the semiconductor substrate inclusive of the metal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention, and are incorporated in and constitute a part of this specification, illustrate embodiments of the claimed invention, and together, with the description serve to explain the principles of the invention. In the drawings:

DETAILED DESCRIPTION OF THE PREFERRED EMBODIMENTS

Reference will now be made in detail to the preferred embodiments of the present invention, examples of which are illustrated in the accompanying drawings.

Figure 1:
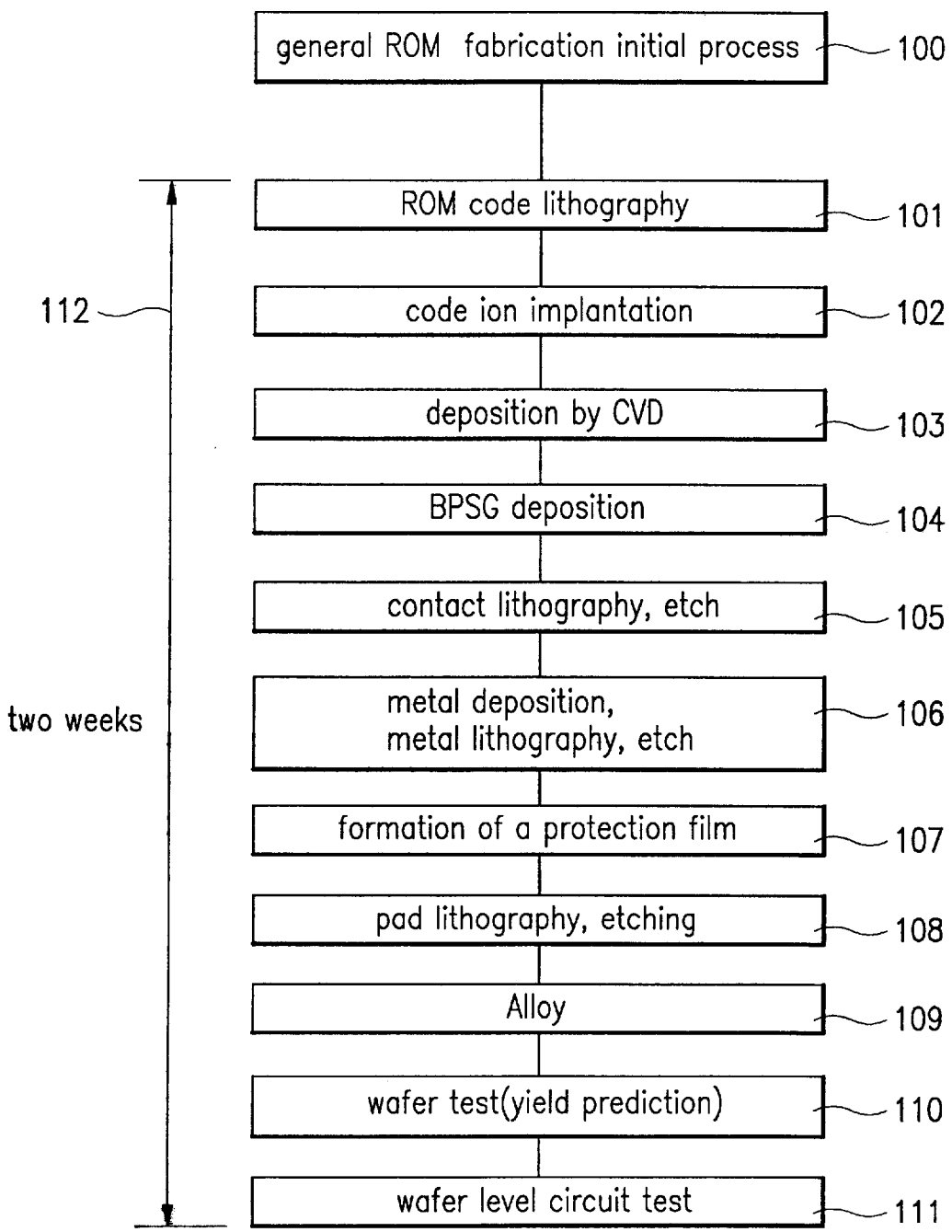
FIG. 1 is a flow chart of the steps of a conventional method of fabricating a mask ROM.
Figure 2A:
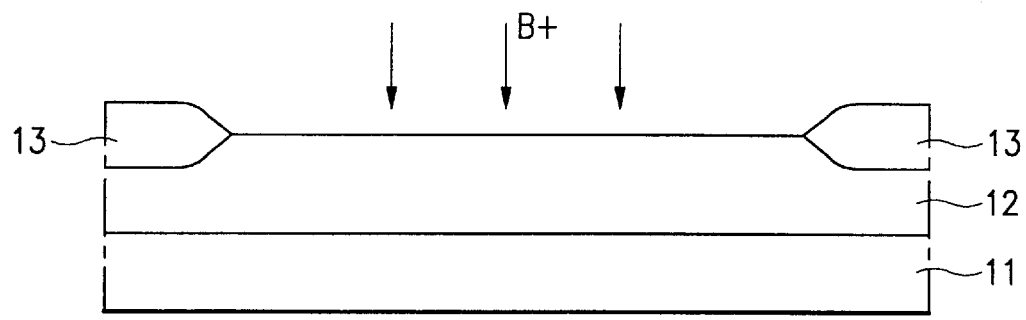
FIGS. 2A through 2D illustrate sections of a semiconductor substrate in a conventional method of fabricating a mask ROM.
Figure 2B:
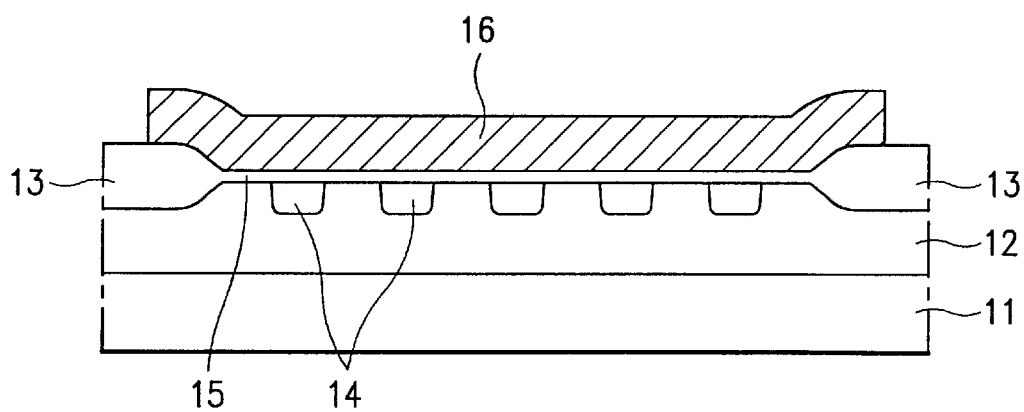
Figure 2C:
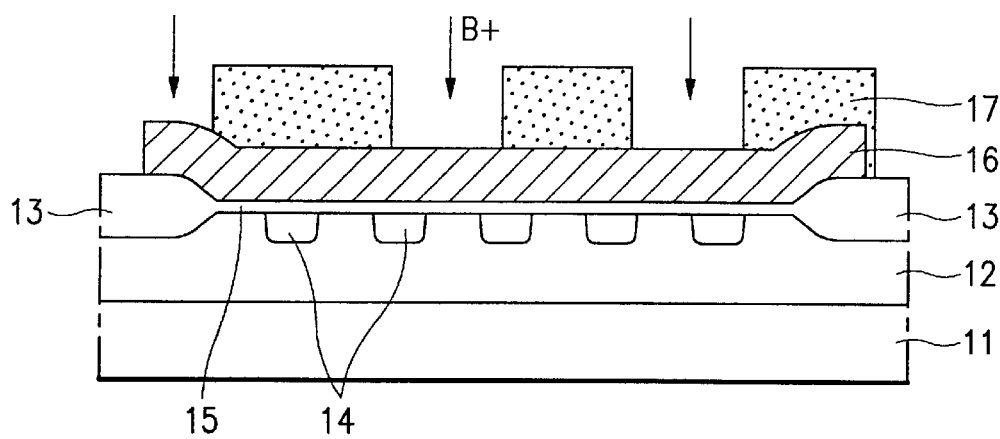
Figure 2D:
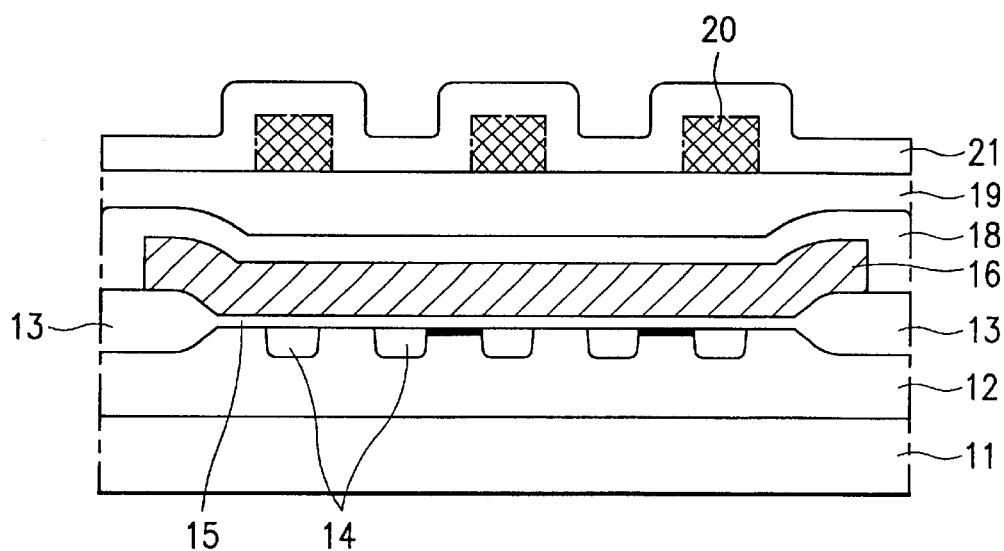
Figure 3:
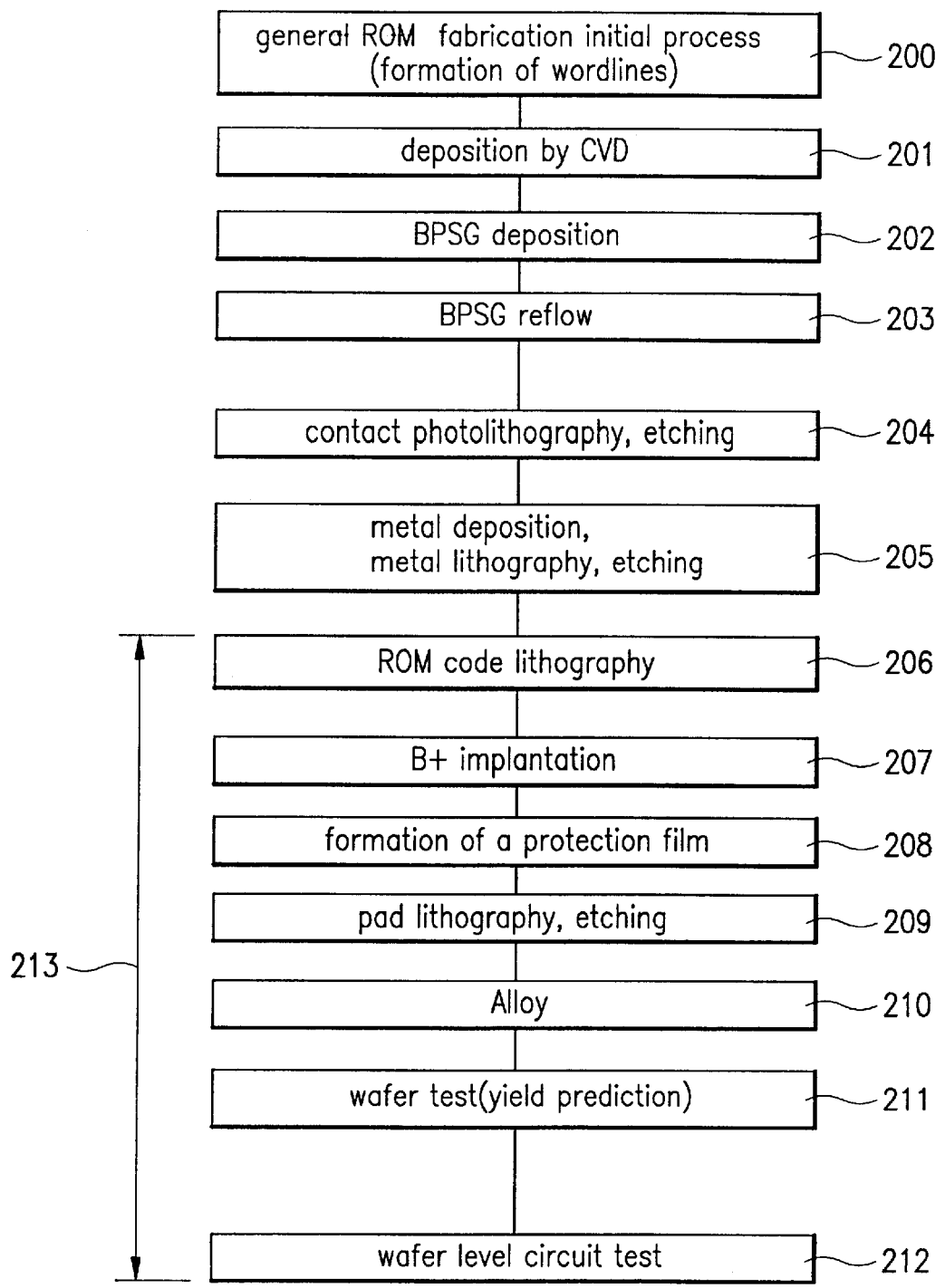
FIG. 3 is a flow chart of the steps of a method of fabricating a mask ROM according to a preferred embodiment of the claimed invention.

Referring to FIG. 3, a preferred embodiment of a method of fabricating a mask ROM according to the invention begins with a wordline formation step 200. In the wordline formation step 200, a plurality of buried bitlines 33 is formed in a semiconductor substrate 30 at fixed intervals and a plurality of wordlines 35 is formed perpendicularly to the buried bitlines 33. The wordlines 35 are used as gates of cell transistors, and the foregoing process is similar to a general ROM initial formation process. An oxide film 36 is deposited on the wordlines 35 by CVD in a CVD deposition step 201. Then, a BPSG film 37 is deposited on the oxide film 36 by CVD in a BPSG deposition step 202. An entire first surface of a structure having the BPSG film 37 formed thereon is annealed for reflowing the BPSG film 37 in a reflowing step 203. In a contact photolithography step 204, a contact hole (not shown) is formed for electrical connection to the buried bitline 33 by photolithography. A metal is deposited on an entire second surface, including the contact hole, and etched by photolithography to form a metal pattern 38 in a metal deposition and etching step 205. In a ROM code lithography step 206, a photoresist film 39 is coated on the metal pattern 38 for a ROM code mask according to custom data, and patterned into the ROM code mask by lithography. The patterned photoresist film is used as a mask in etching the oxide film 36 and the BPSG film 37 to expose a third surface of the substrate 30 in contact with the wordlines 35. Code ions, including boron ions, are implanted in a B+ implantation step 207, and a protection film 40 is formed on an entire fourth surface in a protection film step 208. Pad lithography and etching is conducted in a pad lithography and etching step 209, and an alloy forming process is conducted in an alloy forming step 210. A wafer yield prediction is made in a yield prediction step 211, and a wafer level circuit test is then conducted in a circuit test 212. Thus, fabricating a mask ROM according to the claimed invention results in a reduced turn-around time 213 from the ROM code lithography step 206 to the circuit test 212 pursuant to custom data after the metal pattern 38 is formed.

Figure 4:
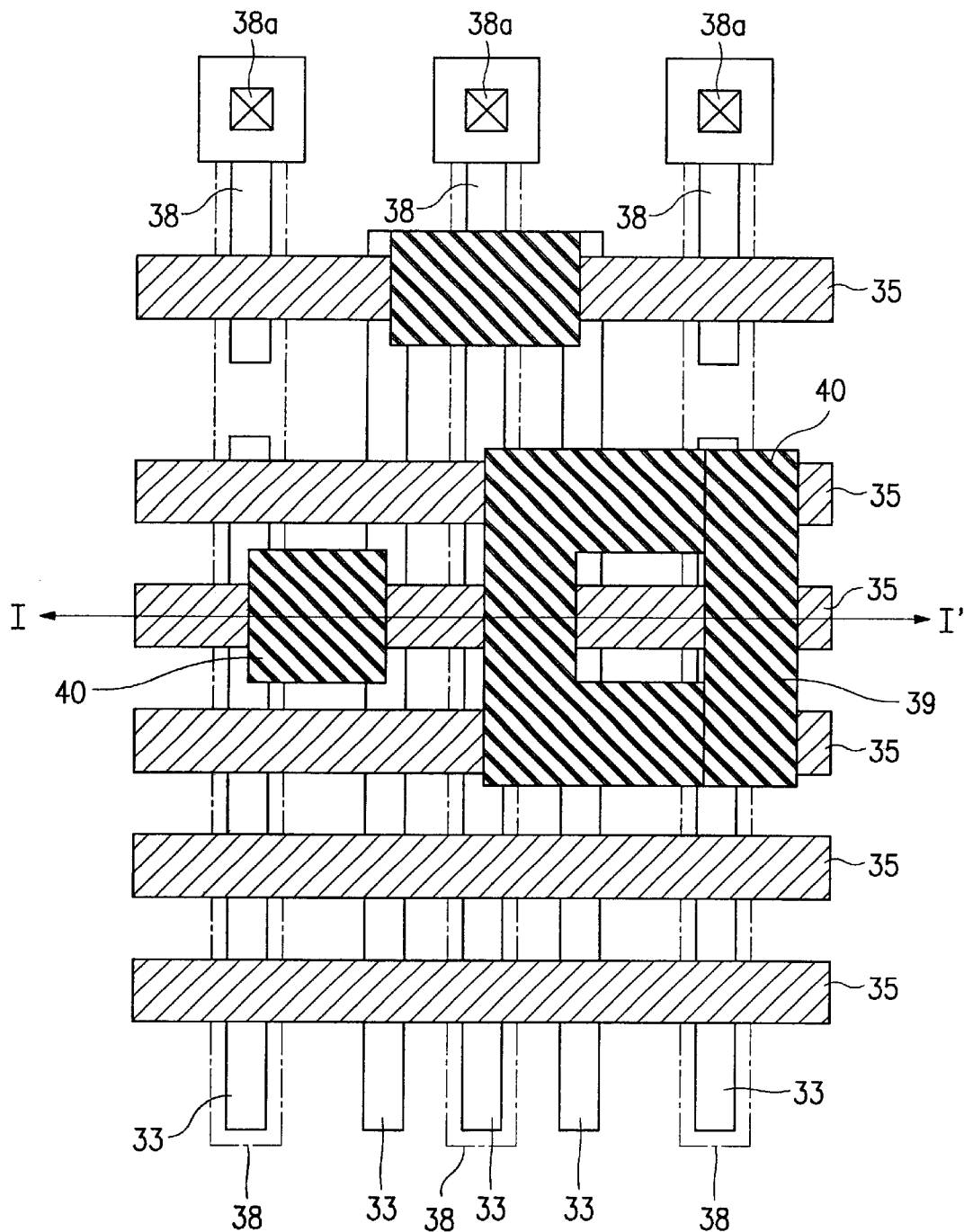
FIG. 4 is a plan view of a mask ROM according to a preferred embodiment of the claimed invention.

Referring to FIG. 4, a plurality of wordlines 35 and buried bitlines 33 are perpendicular to each other, and a plurality of metal patterns 38 are formed over odd-numbered bitlines. A plurality of ROM code ion implantation regions 40 have custom ROM data stored therein. A plurality of bitline contacts 38a electrically connect the buried bitlines 33 to the metal pattern 38. A ROM channel region between the buried bitlines 33 has no metal pattern formed thereon.

Figure 5A:
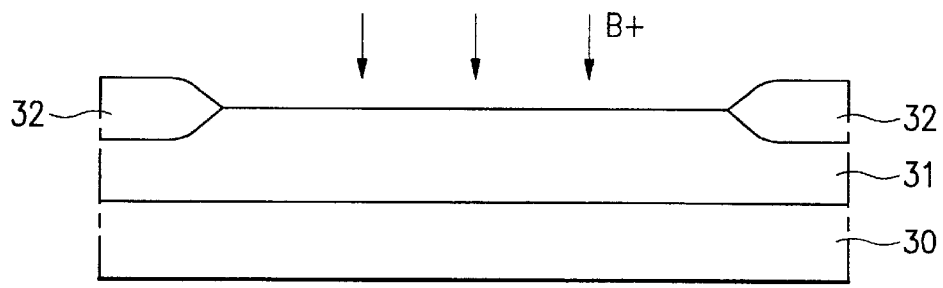
FIGS. 5A through 5F are sections across line I–I' in FIG. 4 showing the steps of a method of fabricating a mask ROM according to a preferred embodiment of the claimed invention.

Referring to FIG. 5A, P-type impurities are first lightly implanted in a first surface of a semiconductor substrate 30, lightly doped with N-type impurities, thereby forming a P-well 31. The substrate 30 having the P-well 31 formed therein is oxidized and a nitride film (not shown) is formed on the substrate 30. A photoresist film (not shown) is coated on the nitride film and patterned by exposure and development. The patterned photoresist film is used as a mask in selectively removing the nitride film to define a field region. A LOCOS process is used to form a field oxide film 32 by removing the nitride film, conducting a field diffusion, and implanting Boron ions in an active region of the substrate 30 for adjusting a threshold voltage.

Figure 5B:
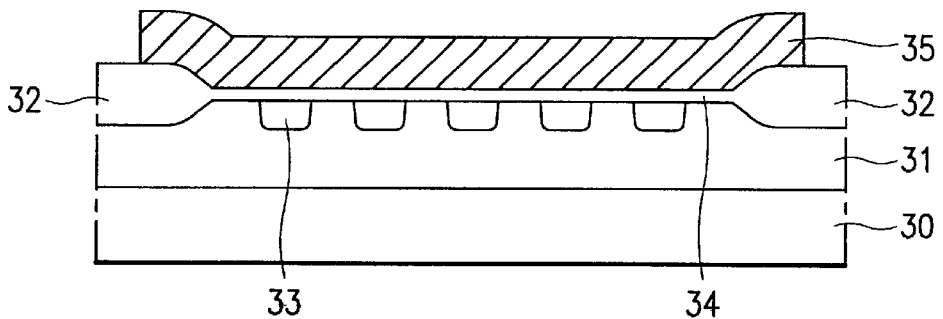

Referring to FIG. 5B, a BN+ mask is used in implanting arsenic (As) ions, N-type impurities, in a second surface of the substrate 30. Annealing is then conducted to activate the As ions, thereby forming buried bitlines 33 in the substrate 30 arranged in parallel at fixed intervals. Then, a gate insulating film 34 is formed on the substrate 30, and doped polysilicon is deposited on the gate insulating film 34 and selectively patterned to form the wordlines 35 in parallel at fixed intervals in a direction perpendicular to the buried bitlines 33.

Figure 5C:
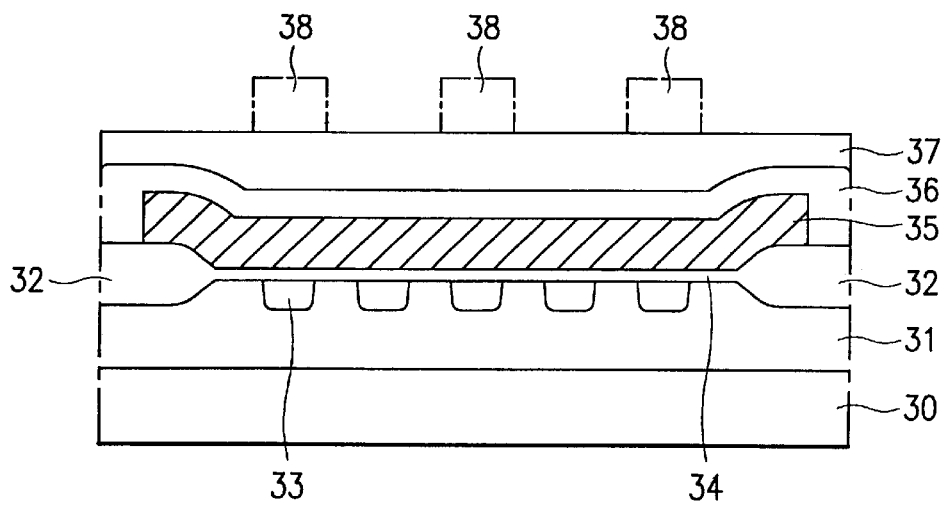

Referring to FIG. 5C, a CVD oxide film 36 and a BPSG film 37 are deposited on the wordlines 35 by CVD and subjected to annealing, thereby reflowing the BPSG film 37. Gates of cell transistors, i.e., the CVD oxide film 36 and the BPSG film 37 over the wordlines 35, are removed. The BPSG film 37 and the CVD oxide film 36 are selectively patterned to form a contact hole (not shown) for electrically connecting to the buried bitlines 33. Aluminum is deposited on an entire third surface inclusive of the contact hole and a photoresist film is coated on the aluminum. The photoresist film is patterned selectively to form the metal pattern 38 inclusive of a bitline contact 38a.

Figure 5D:
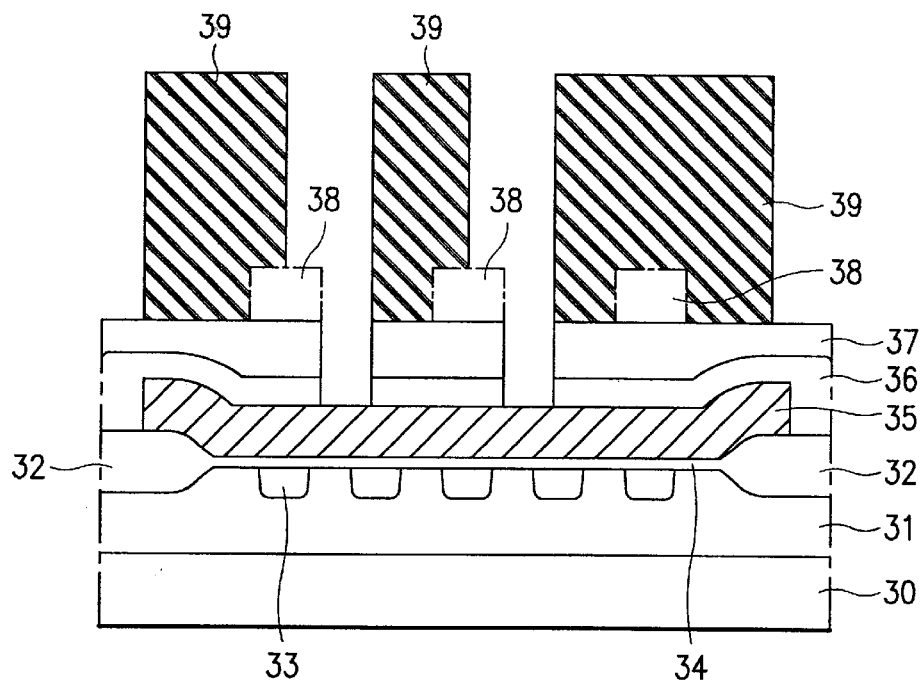

Referring to FIG. 5D, the photoresist film is removed and a second photoresist film is coated on the metal pattern 38 according to custom data, and patterned selectively by exposure and development to form a photoresist film 39 for a ROM code mask. The photoresist film 39 for the ROM code mask is used as a mask in subjecting the CVD oxide film 36 and the BPSG film 37 to selective anisotropic etching, thereby exposing surfaces of the substrate 30 on both sides of the wordline 35. In other words, a plurality of ROM code ion implantation regions 40 are formed.

Figure 5E:
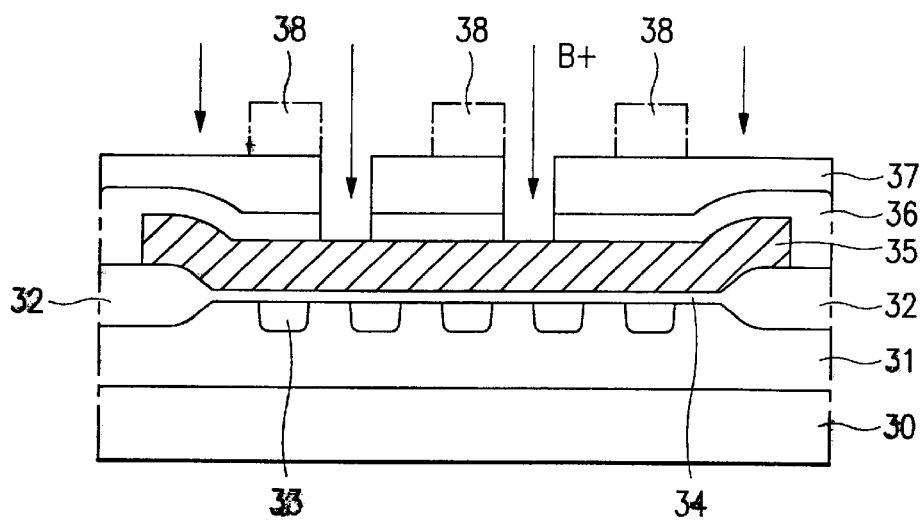

Referring to FIG. 5E, the photoresist film 39 is removed, and code ions, including Boron ions, are implanted in the ROM code ion implanted regions 40 on both sides of the wordlines 35. In contrast to the related art, the BPSG film 37 and the metal pattern 38 are used as masks inclusive of the oxide film 36 etched by using the photoresist film 39 for the ROM code mask in implanting custom code ions.

Figure 5F:
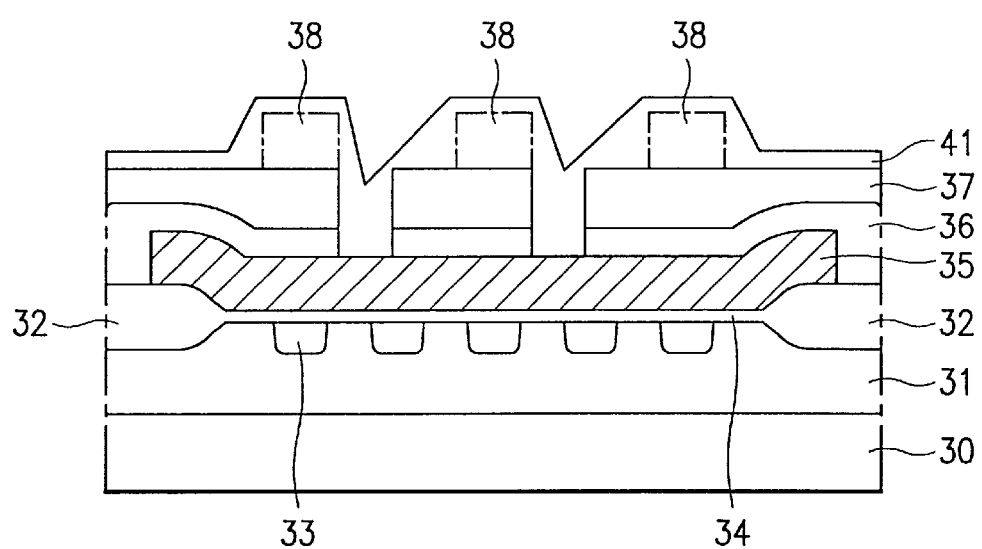

Referring to FIG. 5F, a tetraethyl-ortho-silicate (TEOS) film is deposited on an entire third surface of a structure inclusive of the metal pattern 38 by CVD and etched back, thereby forming a protection film 41. A device having the protection film 41 formed thereon is annealed to activate the implanted boron ions.

Next, after all the cell transistors having a normal threshold voltage, 1.0V, are fabricated, i.e., after the metal pattern 38 is formed, an insulating film is selectively etched using the ROM code mask as a mask in implanting custom ROM code ions at a high ion implantation energy. A cell transistor having a high threshold voltage, 4.5V, is formed by using the code ions, and a mask ROM is programmed by using the cell transistor. Implanting the code ion after the formation of the metal pattern allows for a good yield and for carrying out level circuit tests for all ROM cells except for the custom code, i.e., ROM code. Implanting the code ions according to the custom data after formation of the metal pattern 38 permits the method of fabricating the mask ROM of the claimed invention to reduce custom layers and to reduce a mask turn-around time, thereby improving productivity.

It will be apparent to those skilled in the art that various modifications and alterations can be made in the method of fabricating a mask ROM of the present invention without departing from the spirit or scope of the claimed invention. Thus, it is intended that the present invention cover the modifications and variations of this invention provided they come within the scope of the appended claims and their equivalents.

What is claimed is:

1. A method of fabricating a mask ROM, comprising:
    forming a plurality of buried bitlines in an upper surface of a semiconductor substrate at fixed intervals and a plurality of wordlines on the semiconductor substrate perpendicular to the buried bitlines;
    forming an interlayer insulating film having a bitline contact hole on an entire first surface of the semiconductor substrate inclusive of the wordlines;
    forming a metal pattern in contact with the buried bitlines through the contact hole;
    forming a ROM code mask on the metal pattern;
    forming a plurality of ROM code ion implantation regions by selectively etching the interlayer insulating film with the ROM code mask; and
    forming a protection film on an entire second surface of the semiconductor substrate by implanting ROM code ions in the ROM code ion implanting regions.

2. The method of fabricating a mask ROM according to claim 1, wherein the metal pattern contacts and substantially superposes the buried bitlines.

3. The method of fabricating a mask ROM according to claim 1, wherein the ROM code ion implantation regions are formed by exposing a plurality of substrate surfaces on first and second sides of the wordlines.

4. The method of fabricating a mask ROM according to claim 1, wherein the ROM code mask is formed by depositing a photoresist film on an entire third surface of the semiconductor substrate, inclusive of the metal pattern, and patterning the photoresist film.

5. The method of fabricating a mask ROM according to claim 1, wherein the ROM code ions are implanted by using the metal pattern, inclusive of the interlayer insulating film, as a mask.

6. A method of fabricating a mask ROM comprising:
    forming a plurality of buried bitlines in an upper semiconductor surface at fixed intervals;
    forming a gate insulating film on a semiconductor substrate;
    forming a plurality of wordlines on the gate insulating film perpendicular to the buried bitlines;
    forming an interlayer insulating film on an entire surface of the semiconductor substrate inclusive of the wordlines;
    patterning the interlayer insulating film selectively, to form a contact hole;
    forming a metal layer on an entire first surface of the semiconductor substrate, inclusive of the contact hole, and patterning the metal layer to form a metal pattern;
    depositing a photoresist film on an entire second surface of the semiconductor substrate inclusive of the metal pattern, and exposing and developing the photoresist film to form a second photoresist film for a ROM code mask;
    etching the interlayer insulating film using the second photoresist film for the ROM code mask as a first mask, thereby exposing a plurality of ROM code ion implantation regions;
    removing the second photoresist film for the ROM code mask, thereby exposing a ROM code mask layer;
    implanting code ions into the ROM code ion implantation regions using the ROM code mask layer as a second mask; and
    forming a protection film on an entire third surface of the semiconductor substrate inclusive of the metal pattern.

7. The method of fabricating a mask ROM according to claim 6, wherein the ROM code mask layer includes the metal pattern and the insulating film.

8. The method of fabricating a mask ROM according to claim 6, wherein the interlayer insulating film includes an oxide film and a boron phosphorous silicate glass (BPSG) film formed by chemical vapor deposition (CVD).

9. The method of fabricating a mask ROM according to claim 6, wherein the buried bitlines are formed by implanting arsenic ions.

10. The method of fabricating a mask ROM according to claim 6, wherein the ROM code ion implantation regions are formed by exposing surfaces of the semiconductor substrate on first and second sides of the wordlines.

11. The method of fabricating a mask ROM according to claim 6, wherein the protection film is a tetraethyl-orthosilicate (TEOS) film.

12. The method of fabricating a mask ROM according to claim 11, wherein the protection film is formed by etching back the TEOS film.

* * * * *